US012805230B2

(12) United States Patent
Liu et al.

(10) Patent No.: US 12,805,230 B2
(45) Date of Patent: Nov. 17, 2026

(54) METHOD FOR ADJUSTING LINEWIDTH DUE TO PATTERN LOAD EFFECT IN SADP MANDREL ETCHING

(71) Applicant: Shanghai Huali Integrated Circuit Corporation, Shanghai (CN)

(72) Inventors: Liyuan Liu, Shanghai (CN); Pengkai Xu, Shanghai (CN); Qidong Ru, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 318 days.

(21) Appl. No.: 18/731,909

(22) Filed: Jun. 3, 2024

(65) Prior Publication Data

US 2025/0022717 A1 Jan. 16, 2025

(30) Foreign Application Priority Data

Jul. 11, 2023 (CN) ........................ 202310847828.X

(51) Int. Cl.

| | |
|---|---|
| ***H10P 50/00*** | (2026.01) |
| ***H10P 50/24*** | (2026.01) |
| ***H10P 50/26*** | (2026.01) |
| ***H10P 70/00*** | (2026.01) |
| ***H10P 76/20*** | (2026.01) |
| ***H10P 76/40*** | (2026.01) |

(52) U.S. Cl.

CPC .......... *H10P 50/695* (2026.01); *H10P 50/242* (2026.01); *H10P 50/268* (2026.01); *H10P 50/71* (2026.01); *H10P 70/23* (2026.01); *H10P 76/2041* (2026.01); *H10P 76/4085* (2026.01)

(58) Field of Classification Search

CPC .... H10P 50/695; H10P 50/242; H10P 50/268; H10P 50/71; H10P 70/23; H10P 76/2041; H10P 76/4085; H10P 50/73

See application file for complete search history.

(56) References Cited

U.S. PATENT DOCUMENTS 6,316,329 B1 * 11/2001 Hirota ................. H10W 10/014 257/E21.546

10,755,926 B2 * 8/2020 Arceo De La Pena ...................... H10P 14/3454

2011/0104901 A1 * 5/2011 Yatsuda ................. H10B 41/30 257/E21.214

(Continued)

*Primary Examiner* — Binh X Tran
*Assistant Examiner* — Christopher Remavege
(74) *Attorney, Agent, or Firm* — Banner & Witcoff, Ltd.

(57) ABSTRACT

A method is disclosed for adjusting linewidth due to load effect in SADP mandrel etching. A semiconductor structure includes a TEOS layer, an a-Si layer, an SOC layer and a hard mask layer stacked from bottom to top. A photolithography process defines photoresist trench patterns on the photoresist, which includes a dense pattern area and a sparse pattern area, and the photoresist pattern of the photoresist dense pattern area and the photoresist pattern of the photoresist sparse pattern area present a load effect. The photoresist pattern is pretreated to eliminate the load effect. The hard mask layer is etched according to the photoresist pattern after the load effect is eliminated to form a hard mask pattern structure. This application, by pretreating the photoresist before etching, reduces or even eliminates the load effect, and reduces the deviation of post-etch trench linewidth from the designed trench linewidth.

8 Claims, 3 Drawing Sheets

(56) References Cited

U.S. PATENT DOCUMENTS

| | | | | |
|---|---|---|---|---|
| 2013/0217233 | A1* | 8/2013 | Chang | H10D 30/0243<br>257/E21.214 |
| 2014/0080299 | A1* | 3/2014 | Sel | H10B 41/35<br>438/639 |
| 2014/0342565 | A1* | 11/2014 | Huang | H10D 64/01326<br>438/703 |
| 2015/0064907 | A1* | 3/2015 | Sel | H10P 50/71<br>438/694 |
| 2015/0168841 | A1* | 6/2015 | Matsunaga | G03F 7/2024<br>430/324 |
| 2016/0086848 | A1* | 3/2016 | Shishido | H10B 41/35<br>257/773 |
| 2017/0040221 | A1* | 2/2017 | Kim | H10D 30/024 |
| 2023/0036420 | A1* | 2/2023 | Jeong | G03F 7/0042 |
| 2023/0068421 | A1* | 3/2023 | Zhang | H10B 12/053 |
| 2023/0095970 | A1* | 3/2023 | Huang | C23C 16/045<br>430/5 |
| 2023/0178379 | A1* | 6/2023 | Ho | H10P 14/6328<br>438/211 |
| 2024/0429059 | A1* | 12/2024 | Kang | H10P 50/242 |

* cited by examiner

METHOD FOR ADJUSTING LINEWIDTH DUE TO PATTERN LOAD EFFECT IN SADP MANDREL ETCHING

CROSS-REFERENCE TO RELATED APPLICATIONS

This application claims priority to Chinese patent application No. 202310847828.X, filed on Jul. 11, 2023, the disclosure of which is incorporated herein by reference in its entirety.

TECHNICAL FIELD

This application relates to the field of semiconductor technology, and in particular to a method for adjusting linewidth due to pattern load effect in SADP mandrel etching.

BACKGROUND

With the rapid development of integrated circuits, the continuous improvement of integration level and the continuous reduction of feature dimension, the process of back-end metal lines have been achieved by applying the Self-Aligned Double Patterning (SADP) technology. The SADP technique is a sidewall spacer layer transfer patterning technology, which has the advantage that for any given line patterned by the photolithography process, a spacer layer can be deposited on the sides of the mandrels. After the spacer layer is etched, the original mandrel template material is removed, which can effectively double the line density. This method has excellent linewidth and pitch control effects on high-density parallel lines. After the spacer layer is etched to form spacers on the sides of the mandrels. Finally, a target layer below is finally patterned by using the formed sidewall spacer layer as a mask layer.

A mandrel pattern is defined by the photolithography process, including the dimension of a mandrel trench. A dry etch process is applied to a hard mask dielectric antireflection layer, an amorphous carbon layer and a mandrel layer. As a mask layer for metal wiring, the mandrel pattern may include different linewidths. During the dry etching of the mandrels, different patterns will induce load effect from sparse or dense pattern linewidths. For example, photoresist development residue defects may appear in a dense pattern area and a sparse pattern area after photoresist development; and there are also morphology differences between the dense pattern area and the sparse pattern area shown in the developed photoresist patterns.

Because of the design limitation in the mask layout and the process window limitation of the photolithography process, it is necessary to have a method for adjusting pattern linewidth load in the dry etching process.

BRIEF SUMMARY

This application provides a method for adjusting linewidth due to pattern load effect in SADP mandrel etching, for solving sparse and dense pattern load effect after photoresist development.

The method for adjusting linewidth due to pattern load effect in SADP mandrel etching, at least including:

step 1: providing a semiconductor structure, forming a stack of layers on the semiconductor structure, including from bottom to top, a tetraethyl orthosilicate (TEOS) layer, an amorphous-silicon (a-Si) layer, an amorphous carbon (SOC) layer and a hard mask layer; spin-coating a layer of photoresist on the hard mask layer, and performing a photolithography process to define trench linewidths in a dense pattern area and a sparse pattern area in the photoresist, where a load effect is presented in the dense and the sparse pattern areas;

step 2: pretreating the photoresist trench pattern in the dense pattern area and the sparse pattern area in the photoresist to eliminate the load effect;

step 3: etching the hard mask layer based on the photoresist trench pattern after the load effect is eliminated is step 2 till the surface of the SOC layer is exposed to following the hard mask pattern;

step 4: etching the SOC layer through the hard mask pattern till the surface of the a-Si layer is exposed to form an SOC pattern;

step 5: etching the a-Si layer following the SOC pattern till the surface of the TEOS layer is exposed to form a mandrel structure; and step 6: removing the SOC pattern.

Exemplarily, in step 1, the load effects on the dense pattern in the photoresist include occurrence of photoresist residues at the bottom of trench pattern after photoresist development in the photolithography process, and/or sidewall tilting in the photoresist after photoresist development in the photolithography process. The load effect results in photoresist trench linewidth different from what is designed.

Exemplarily, in step 1, the load effect on sparse pattern in the photoresist includes the occurrence of photoresist residue at the bottom of the trench after photoresist development in the photolithography process, and/or sidewall tilting in the photoresist after photoresist development in the photolithography process. The load effect results in photoresist trench linewidth deviation from what is designed.

Exemplarily, in step 1, the trench linewidth deviation in photoresist from what is designed in sparse pattern area is greater than in dense pattern area.

Exemplarily, in step 1, the hard mask layer is a dielectric antireflection layer.

Exemplarily, in step 4, the SOC layer is etched by applying a dry etching method to form the SOC pattern structure.

Exemplarily, in step 5, the a-Si layer is etched by applying a dry etching method to form the mandrel structure.

Exemplarily, in step 6, the SOC pattern structure is removed by applying ashing dry etching.

Exemplarily, in step 2, a method for pretreating the photoresist pattern of the dense pattern area includes: eliminating the photoresist residue at the bottom of the trench of the photoresist pattern in the dense pattern area, and eliminating the sidewall tilting of the photoresist pattern by applying ultraviolet light, so as to mitigate the trench linewidth deviation in photoresist from what is designed.

Exemplarily, in step 2, a method for pretreating the photoresist pattern of the sparse pattern area includes: eliminating the photoresist residue at the bottom of the trench of the photoresist pattern in the sparse pattern area, and eliminating the sidewall tilting of the photoresist pattern by applying an ultraviolet light, so as to mitigate the trench linewidth deviation in photoresist from what is designed.

As described above, the method for adjusting linewidth due to pattern load effect in SADP mandrel etching provided in this application has the following beneficial effects: this technique, by pretreating the photoresist before etching, at least reduces or even eliminates the load effect of the photoresist, and reduces the post-etch trench linewidth deviation from what is designed.

DETAILED DESCRIPTION OF THE EMBODIMENTS

The embodiments of this application will be described below through specific examples. Those skilled in the art can easily understand the other advantages and effects of this application from the content disclosed in this description. This application may also be implemented or applied through different specific embodiments. The details in this description may be modified or changed based on different perspectives and applications without deviating from the spirit of this application.

Please refer to FIG. 1 to FIG. 7. It should be noted that the drawings provided in the embodiments are only intended to schematically describe the basic concept of this application. Therefore, the drawings only illustrate the components related to this application, and are not drawn according to the number, shape, and size of the components during actual implementation. The type, quantity, and scale of each component during actual implementation may be randomly changed, and the layout of the component may also be more complex.

Figure 7:
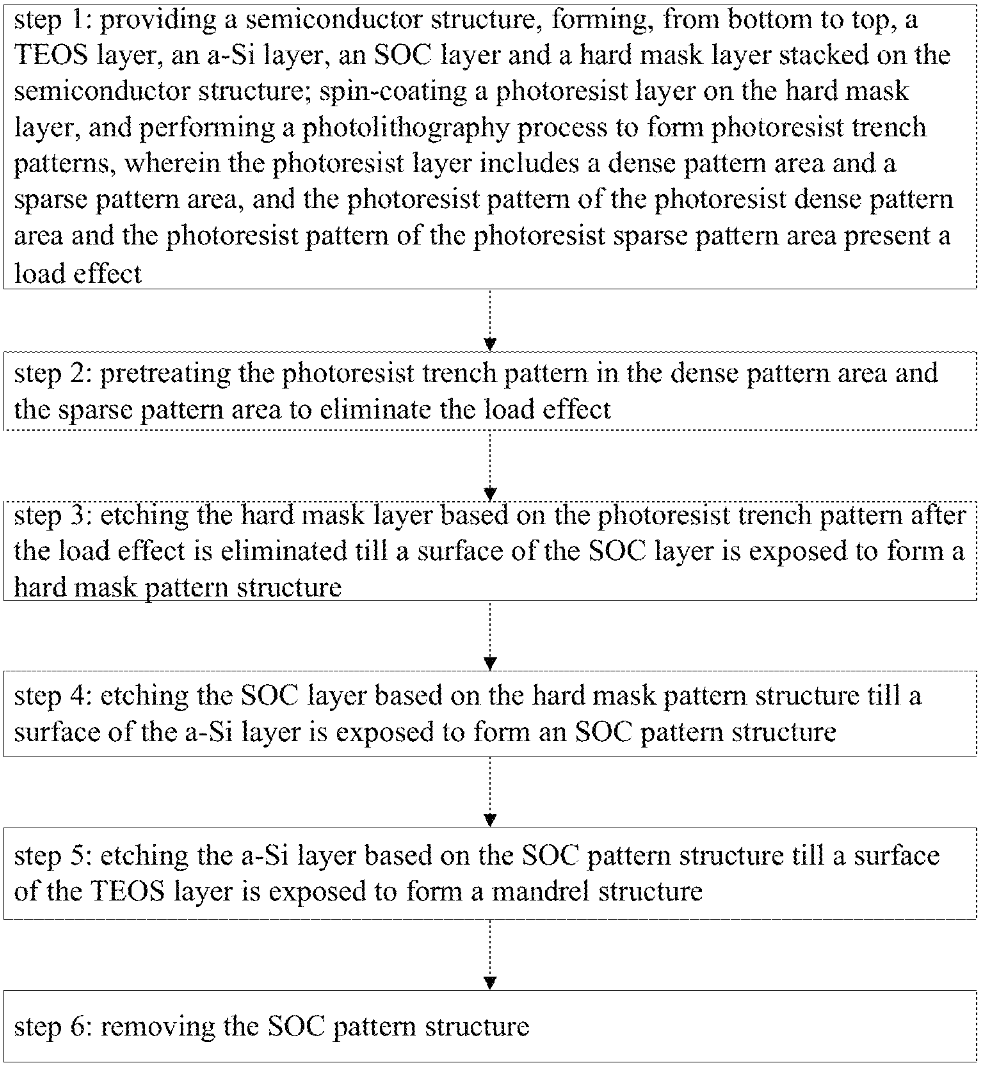
FIG. 7 illustrates a flowchart of the method for adjusting linewidth due to pattern load effect in SADP mandrel etching according to this application.

This application provides a method for adjusting linewidth due to pattern load effect in SADP mandrel etching. Referring to FIG. 7, the method at least includes the following steps:

In step 1, a semiconductor structure is provided. A stack of layers is formed on the semiconductor structure, including from bottom to top, a TEOS layer, an a-Si layer, an SOC layer and a hard mask layer. Spin-coating a layer of photoresist on the hard mask layer, followed by performing a photolithography process to define trench linewidths in the photoresist in a dense pattern area and a sparse pattern area in the photoresist. A load effect is presented in the photoresist dense and sparse pattern areas.

Figure 1:
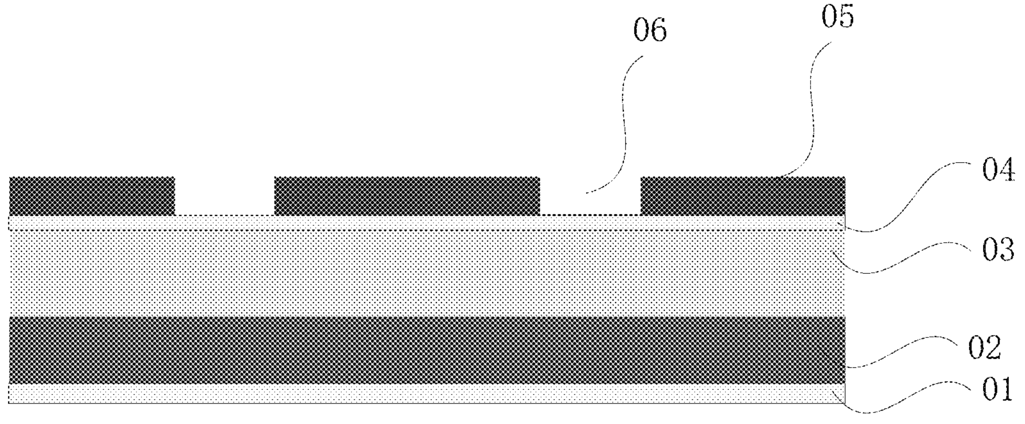
FIG. 1 to FIG. 6 illustrate schematic diagrams of structures formed in various steps in the method for adjusting linewidth due to pattern load effect linewidths in SADP mandrel etching according to this application.

Referring to FIG. 1, the semiconductor structure includes a TEOS layer 01, an a-Si layer 02, an SOC layer 03 and a hard mask layer stacked from bottom to top. A layer of photoresist is spin-coated on the hard mask layer, and then trench linewidth is defined by performing a photolithography process to form a dense photoresist pattern area and a sparse photoresist pattern area (in FIG. 1, the photoresist dense pattern area and the photoresist sparse pattern area are not separately marked as 05). The photoresist dense pattern area and the photoresist sparse pattern area present a load effect. In FIG. 1, the trench in the photoresist dense pattern area and trench in the photoresist sparse pattern area are not separately marked by the same reference number 06.

Further, according to this embodiment of this application, in step 1, the load effect of the dense photoresist pattern area leaves photoresist residue at the bottom of the photoresist pattern trench, and also sidewall tilting of the photoresist pattern, both formed after the photolithography development process. The load effect results in the deviation of the photoresist trench linewidth from the designed trench linewidth.

Further, according to this embodiment of this application, in step 1, the load effect of the photoresist sparse pattern area induces photoresist residue at the bottom of the photoresist pattern trench, and also sidewall tilting of the photoresist pattern, both formed after the photolithography development process. The load effect results in the deviation of the photoresist trench linewidth from the designed trench linewidth.

Further, according to this embodiment of this application, in step 1, the trench linewidth deviation in photoresist from what is designed and expected in sparse pattern area is greater than in dense pattern area. These deviations of critical dimension (herein the trench) both in dense and in sparse pattern trenches are the results of the synergistic change among isotropic chemical etching, anisotropic physical bombardment etching, and trench sidewall polymer deposition protection, etc. In general, etching plasma groups require different consumptions for different pattern densities, the amount of by-product polymers produced also varies, in addition, the dense pattern area and the sparse pattern area produce different concentrations of chemical and polymer groups. At the end if these output groups cannot be discharged in a timely manner, a load effect appears.

The dense pattern area has significantly higher sidewall density than the sparse pattern area, so there is more exposed material for etch compared to the sparse pattern area. Any variations when depositing either etchants for the isotropic chemical etching groups to be used for etching reactions, or plasma ambient polymers, will weaken the sidewall production.

On the contrary, the variations in etching groups and/or polymer deposition resulting from variations of the etching reaction parameters will be amplified in the sparse trench area. This results in sparse trench patterns being more sensitive to variations in etching parameters than dense trench patterns.

Further, according to this embodiment, in step 1, the hard mask layer is a dielectric antireflection layer.

In step 2, the photoresist dense pattern area and the photoresist sparse pattern area are pretreated to eliminate the load effect.

Further, according to this embodiment, in step 2, a method for pretreating the photoresist dense pattern area includes: eliminating the photoresist residue from the bottom of the photoresist dense trenches, and eliminating the sidewall tilting of the photoresist pattern by applying an ultraviolet light, so as to mitigate the trench linewidth deviation in photoresist from what is designed.

Further, according to this embodiment, in step 2, a method for pretreating the photoresist sparse pattern area includes: eliminating the photoresist residue from the bottom of the photoresist sparse trenches, and eliminating the sidewall tilting of the photoresist pattern by applying an ultraviolet light, so as to mitigate the trench linewidth deviation in photoresist from what is designed.

Figure 2:
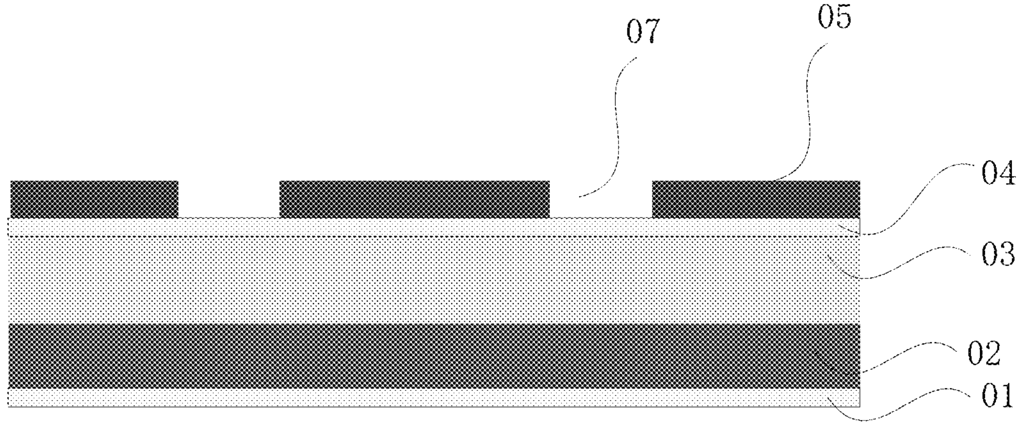

In FIG. 2, the trench of the photoresist pattern after the pretreatment of the dense and sparse photoresist patterns. The dense and sparse photoresist pattern trenches are shown as 07 after the load effect is eliminated (they are not separately marked as different reference numbers).

Figure 3:
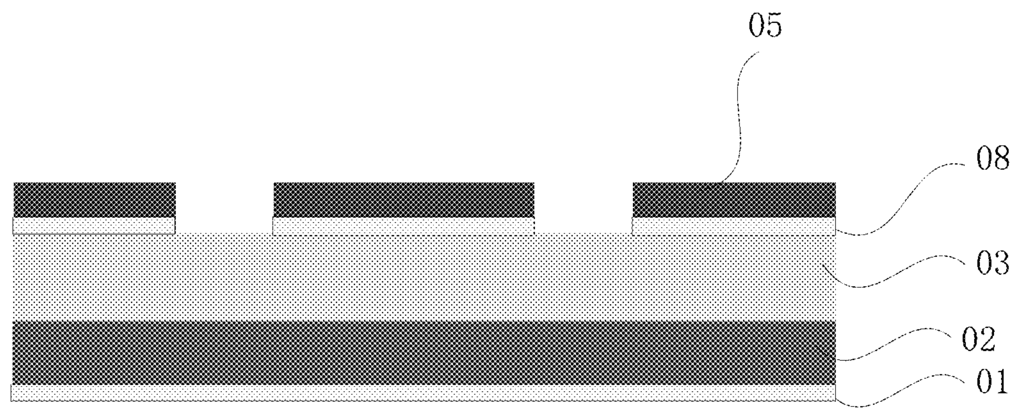

In step 3, after the load effect is eliminated in step 2, the hard mask layer is etched based on the photoresist pattern, till a surface of the SOC layer is exposed to form a hard mask pattern structure. Referring to FIG. 3, the hard mask layer is etched based on the photoresist pattern 05 after the load effect is eliminated till a surface of the SOC layer 03 is exposed to form a hard mask pattern structure 08.

Figure 4:
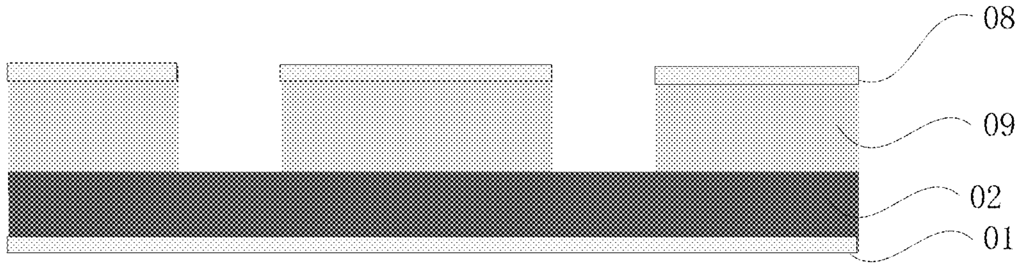

In step 4, the SOC layer is etched based on the hard mask pattern structure till a surface of the a-Si layer is exposed to form an SOC pattern structure. Referring to FIG. 4, the SOC layer is etched based on the hard mask pattern structure 08 till a surface of the a-Si layer 02 is exposed to form an SOC pattern structure 09.

Further, according to this embodiment, in step 4, the SOC layer is etched by applying a dry etching method to form the SOC pattern structure.

Figure 5:
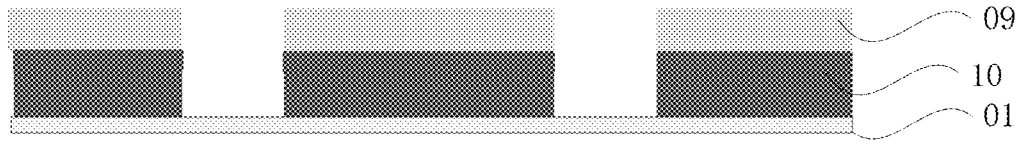

In step 5, the a-Si layer is etched based on the SOC pattern structure till a surface of the TEOS layer is exposed to form a mandrel structure. Referring to FIG. 5, the a-Si layer is etched based on the SOC pattern structure 09 till a surface of the TEOS layer 01 is exposed to form a mandrel structure 10.

Further, in this embodiment of this application, in step 5, the a-Si layer is etched by applying a dry etching method to form the mandrel structure.

Figure 6:
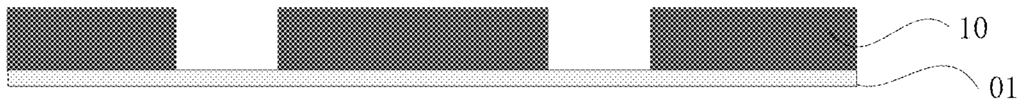

In step 6, the SOC pattern structure is removed to form a structure in FIG. 6.

Further, in this embodiment of this application, in step 6, the SOC pattern structure is removed by applying ashing dry etching. Thus, the mandrel structure has the post-etch trench linewidth shown in FIG. 6

To sum up, by pretreating the photoresist before etching, this technique reduces or even eliminates the load effect of the photoresist pattern density, reduces the deviation of the post etch trench linewidth from the as-designed and expected linewidth, and also reduces the trench linewidth difference between the dense pattern area and the sparse patten area. Therefore, this disclosed technique effectively overcomes various disadvantages in the existing technology, thus has a great industrial utilization value.

The above embodiments only exemplarily describe the principle and effect of this application, and are not intended to limit this application. Those skilled in the art may modify or change the above embodiments without departing from the spirit and scope of this application. Therefore, all equivalent modifications or changes made by those skilled in the art without departing from the spirit and technical concept disclosed in this application should still be covered by the claims of this application.

What is claimed is:

1. A method for adjusting linewidth due to a load effect in Self-Aligned Double Patterning (SADP) mandrel etching, at least comprising:

step 1: providing a semiconductor structure, forming, from bottom to top, a tetraethyl orthosilicate (TEOS) layer, an amorphous silicon (a-Si) layer, an amorphous carbon (a-C) layer and a hard mask layer stacked on the semiconductor structure; spin-coating a photoresist layer on the hard mask layer, and performing a photolithography process to form photoresist trench patterns, wherein the photoresist layer includes a dense pattern area and a sparse pattern area, and wherein the load effect occurs as uneven linewidth of the photoresist trench patterns between the dense pattern area and the sparse pattern area;

step 2: pretreating the photoresist trench pattern in the dense pattern area and the sparse pattern area to eliminate the load effect, comprising: cleaning photoresist residues from a bottom of the photoresist trench patterns, and eliminating a sidewall tilting of the photoresist trench pattern by applying an ultraviolet light, so as to mitigate a deviation of a photoresist trench linewidth from a designed trench linewidth;

step 3: etching the hard mask layer based on the photoresist trench pattern after the load effect is eliminated in step 2 until a surface of the a-C layer is exposed after a hard mask pattern structure is formed;

step 4: etching the a-C layer based on the hard mask pattern structure until a surface of the a-Si layer is exposed after an a-C pattern structure is formed;

step 5: etching the a-Si layer based on the a-C pattern structure until a surface of the TEOS layer is exposed after a mandrel structure is formed; and step 6: removing the a-C pattern structure.

2. The method for adjusting linewidth due to the load effect in SADP mandrel etching according to claim 1, wherein in step 1, the load effect of the photoresist trench pattern in the dense pattern area comprises photoresist residues at the bottom of the photoresist trench pattern formed after photoresist development during the photolithography process in the dense pattern area, and the sidewall tilting of the photoresist trench pattern formed after the development during the photolithography process in the dense pattern area, wherein the photoresist residues and the sidewall tilting result in the deviation of the photoresist trench linewidth from the designed trench linewidth in the dense pattern area.

3. The method for adjusting linewidth due to the load effect in SADP mandrel etching according to claim 1, wherein in step 1, the load effect of the photoresist trench pattern in the sparse pattern area further comprises photoresist residues at the bottom of the photoresist trench pattern in the sparse pattern area formed after photoresist development during the photolithography process, and the sidewall tilting of the photoresist trench pattern formed in the sparse pattern area after the development during the photolithography process, wherein the photoresist residues and the sidewall tilting result in the deviation of the photoresist trench linewidth from the designed trench linewidth in the sparse pattern area.

4. The method for adjusting linewidth due to the load effect in SADP mandrel etching according to claim 1, wherein in step 1, the deviation of the photoresist trench linewidth from the designed trench linewidth in the sparse pattern area is greater than the deviation of the photoresist trench linewidth from the designed trench linewidth in the dense pattern area.

5. The method for adjusting linewidth due to the load effect in SADP mandrel etching according to claim 1, wherein in step 1, the hard mask layer is a dielectric antireflection layer.

6. The method for adjusting linewidth due to the load effect in SADP mandrel etching according to claim 1, wherein in step 4, the a-C layer is etched by applying a dry etching method to form the a-C pattern structure.

7. The method for adjusting linewidth due to the load effect in SADP mandrel etching according to claim 1, wherein in step 5, the a-Si layer is etched by applying a dry etching method to form the mandrel structure.

8. The method for adjusting linewidth due to the load effect in SADP mandrel etching according to claim 1, wherein in step 6, the a-C pattern structure is removed by applying ashing dry etching.

* * * * *